US007027309B2

(12) United States Patent
Franz et al.

(10) Patent No.: US 7,027,309 B2
(45) Date of Patent: Apr. 11, 2006

(54) ENGAGING/DISENGAGING MECHANISM

(75) Inventors: John P. Franz, Houston, TX (US); Wade D. Vinson, Magnolia, TX (US); Arthur G. Volkmann, Spring, TX (US); David Deis, Spring, TX (US); George D. Megason, Spring, TX (US); Joseph R. Allen, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/783,146

(22) Filed: Feb. 20, 2004

(65) Prior Publication Data

US 2005/0186816 A1 Aug. 25, 2005

(51) Int. Cl.
*H05K 7/12* (2006.01)
*H05K 7/14* (2006.01)

(52) U.S. Cl. ...................... 361/798; 361/801; 361/740; 361/747; 361/759; 361/732

(58) Field of Classification Search ................ 361/726, 361/732, 740, 747, 759, 754, 801, 796, 798; 312/215, 216, 222; 254/120; 74/469
See application file for complete search history.

(56) References Cited

U.S. PATENT DOCUMENTS

| | | | | |
|---|---|---|---|---|
| 3,718,362 | A * | 2/1973 | Butz | 294/112 |
| 4,413,399 | A * | 11/1983 | Crawford et al. | 29/428 |
| 4,982,303 | A | 1/1991 | Krenz | |
| 5,691,859 | A * | 11/1997 | Ulrich et al. | 360/92 |
| 5,722,843 | A | 3/1998 | Kerckhof et al. | |
| 5,791,753 | A | 8/1998 | Paquin | |
| 5,829,994 | A | 11/1998 | Oda et al. | |
| 5,915,100 | A | 6/1999 | Crump et al. | |
| 6,099,330 | A | 8/2000 | Gundermann et al. | |
| 6,252,514 | B1 * | 6/2001 | Nolan et al. | 340/686.4 |
| 6,354,164 | B1 | 3/2002 | Megason et al. | |
| 6,381,149 | B1 | 4/2002 | Megason et al. | |
| 6,424,111 | B1 * | 7/2002 | Romig | 318/568.21 |
| 6,498,731 | B1 | 12/2002 | Roscoe et al. | |
| 6,714,505 | B1 * | 3/2004 | Yoshida et al. | 720/616 |
| 6,975,519 | B1 * | 12/2005 | Siahpolo et al. | 361/798 |

* cited by examiner

*Primary Examiner*—Kamand Cuneo
*Assistant Examiner*—Dameon E. Levi

(57) ABSTRACT

According to one embodiment, the present invention includes a first electrical connector located on a computer component and a biasing mechanism having a leverage member, such that actuation of the leverage member biases the first electrical connector between engaged and disengaged positions with respect to a second electrical connector separate from the computer component.

19 Claims, 10 Drawing Sheets

ENGAGING/DISENGAGING MECHANISM

BACKGROUND

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Typical computer devices include a number of components assigned to accomplish various tasks. For example, a computer device may include, processors, memory components, cooling devices, data storage devices, and other desired components. These components may electrically couple with one another over electrical pathways, such as etched wiring pathways located on one or more printed circuit boards. To facilitate coupling and uncoupling of the components with respect to one another, these wiring pathways may extend to one or more electrical connectors. For example, one or more processors may couple to a first connector mounted to a circuit board. Similarly, a second connector may electrically communicate with various other components of the computer device. To facilitate coupling between connectors, one connector may comprise a series of pins that mate with a series of corresponding slots located on the second connector, i.e., a pin-and-slot connector pair. Accordingly, upon engagement of the two connectors, their respective components may be electrically coupled to one another.

Over time, as the number of electrical connections on a connector increases, the forces to facilitate engagement and disengagement between two connectors also generally increase. For example, in a pin-and-slot connector configuration, the frictional resistance between pins and slots increases with the number of pin-and-slot pairs. In certain applications, the appropriate amount of engagement or disengagement force may be burdensome or unwieldy to apply. Additionally, improper application of the force may cause damage to one or both of the connectors. For example, improper application of forces between a pin-and-slot connection pair may cause the pins to misalign with respect to the slots, thereby causing the pins to bend or break.

BRIEF DESCRIPTION OF THE DRAWINGS

Advantages of one or more disclosed embodiments may become apparent upon reading the following detailed description and upon reference to the drawings in which.

DETAILED DESCRIPTION OF SPECIFIC EMBODIMENTS

One or more specific embodiments of the present technique will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed further below, certain embodiments of the present invention comprise a mechanism for biasing a first electrical connector into engagement or disengagement with a second electrical connector. As one example, the biasing mechanism comprises an actuation member coupled to first and second engagement members located on opposite sides of a centerline of a computer component. By pivoting the actuation member, the first and second engagement members synchronously pivot to bias a first electrical connector between engaged and disengaged positions with respect to a second electrical connector. As an alternate exemplary embodiment, the biasing mechanism comprises an actuation member located substantially along a centerline of an electronics substrate. By actuating the actuation member, the exemplary biasing mechanism biases an electrical connector coupled to the substrate into engagement with a second electrical connector coupled to a chassis. Advantageously, the exemplary biasing mechanisms may facilitate a linear path of travel of the electrical connectors with respect to one another, while providing engagement forces that facilitate engagement and disengagement of the electrical connectors with respect to one another. Moreover, by limiting moment forces acting on the computer component, the likelihood of misalignment between the connectors may be mitigated.

Figure 1:
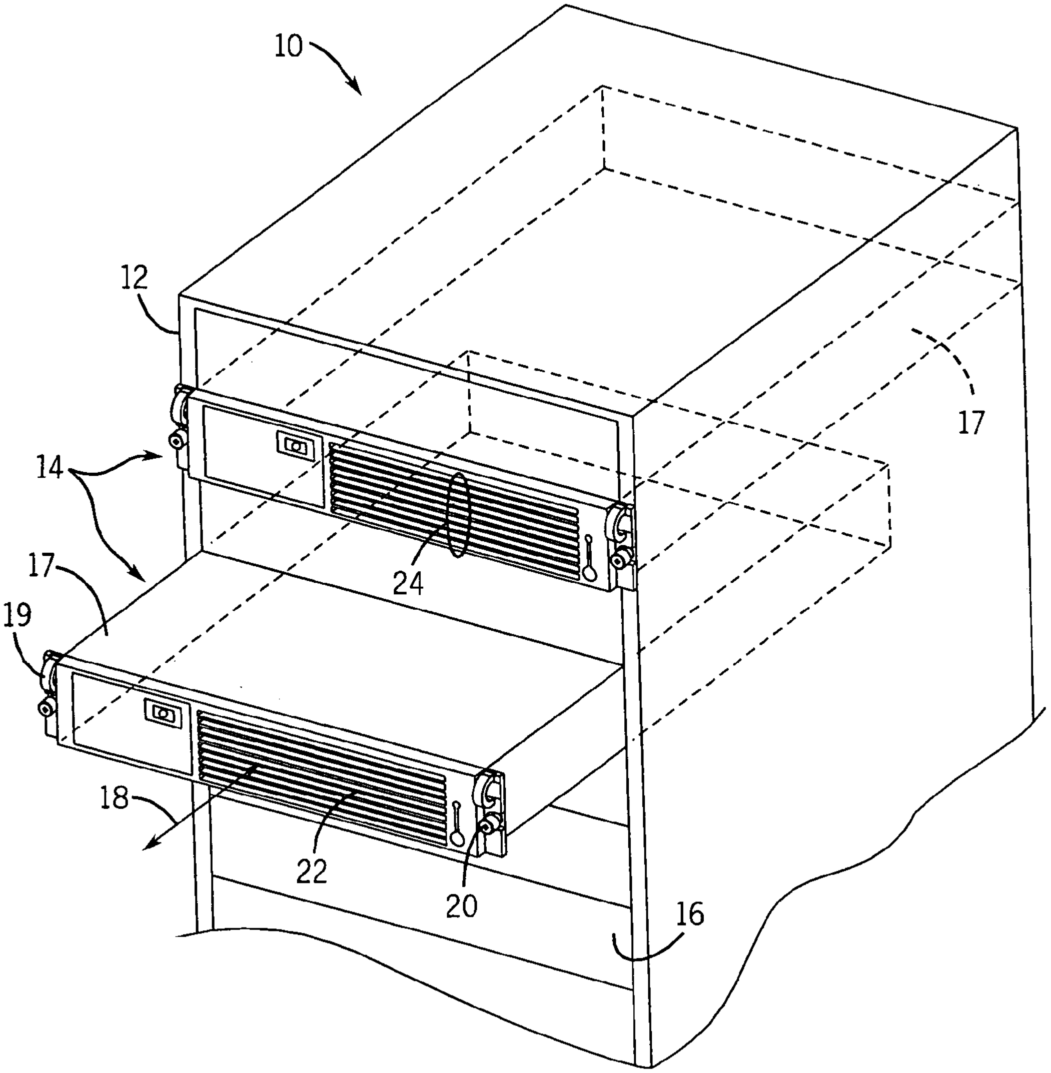
FIG. 1 illustrates a perspective view of an exemplary rack mounted system having a pair of computer devices in accordance with embodiments of the present invention.

Turning to the figures, FIG. 1 illustrates a portion of an exemplary rack mounted computer system, generally referenced by numeral 10. By way of example, rack mounted computer systems 10 may provide relatively large amounts of processing power for use in Internet, intranet, and multitasking applications, among others. However, it should be noted that the disclosed embodiments are equally applicable to non-rack mounted systems, such as desktop computers and portable computers. The exemplary rack mounted computer system 10 includes a protective rack 12 that houses one or more computer devices 14 within individual bays 16 of the rack 12. As discussed further below, each computer device 14 includes a chassis 17 that secures and houses various components of the computer device 14. Advantageously, the exemplary rack 12 provides an enclosure that further protects the computer device 14, particularly the sensitive components of the computer device 14, from inadvertent damage. Moreover, the rack 12 facilitates assembly of a plurality of computer devices 14 in an organized manner.

Over time, the computer device 14 may require component servicing or replacement. Accordingly, to facilitate access to the various components of the computer device 14 and to the computer device 14 itself, a pair of telescoping rails (not shown) may secure the computer device 14 to the rack 12. These telescoping rails may permit inward and outward movement of the computer device 14 with respect to the rack 12, as represented by bi-directional arrow 18. Advantageously, handles 19 located on the computer device 14 may assist a technician and/or operator in displacing the computer device 14 with respect to the rack 12. However, the computer device 14 may also include fasteners 20, such as the illustrated screws, to secure the computer device 14 within the rack 12 and prevent inadvertent movement of the computer device 14 during operation.

The computer device 14 may also include a bezel 22 that contains a number of features advantageous to the operation of the computer device 14. For example, the bezel 22 may include a louvered section 24 that facilitates cooling airflow through the computer device 14. The bezel 22 may comprise a single contiguous unit or may comprise an assembly of parts.

Figure 2:
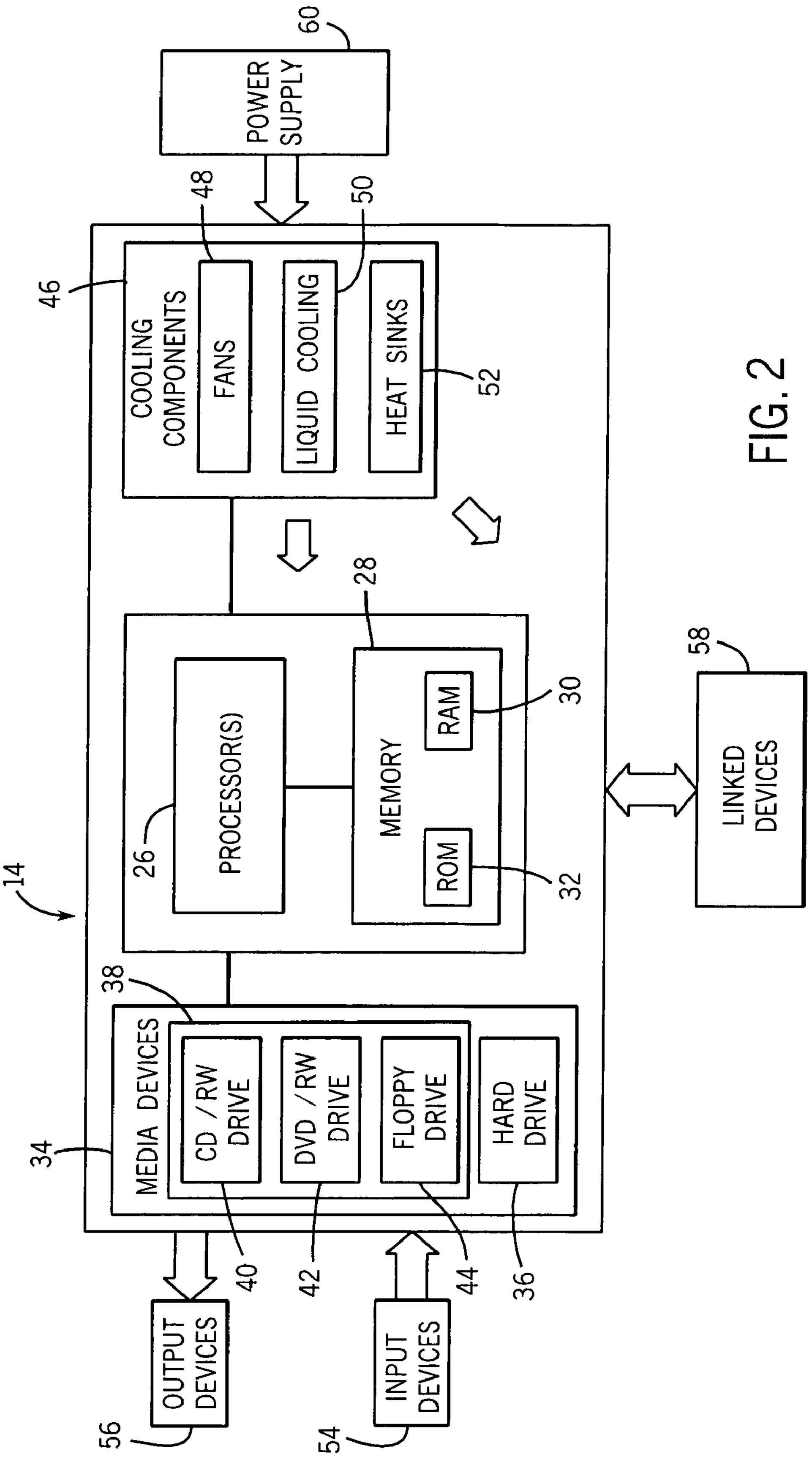
FIG. 2 illustrates a diagrammatical representation of an exemplary computer device in accordance with embodiments of the present invention.

FIG. 2 illustrates an exemplary computer device 14 in diagrammatical form. The exemplary computer device 14 includes various computer components. For example, the computer device 14 includes one or more processors 26, such as a microprocessor, that control many of the functions and operations of the computer device 14. The processor 26 may operate under the direction of software programming, such as an operating system, for example. The software programming may coordinate operations of the processor 26 and other components of the computer device 14. The computer device 14 may also include memory components 28, such as random access memory (RAM) components 30 and read only memory (ROM) components 32, which may store software programming to facilitate execution of the software programming.

The exemplary computer device 14 also includes media devices 34 that may store data for use by the computer device 14 and/or the rack computer system 10 (see FIG. 1). By way of example, a media device 34 may comprise a hard disk drive 36 that includes one or more hard disks that are generally dedicated to the computer device 14. By contrast, portable media devices 38 may receive media that are not dedicated to a particular computer device 14. Portable media devices 38 include a compact disk read and/or write drive (CD/RW) 40, a digital video disk read and/or write drive (DVD/RW) 42, and/or a floppy disk drive 44, among others. Advantageously, the media devices 34 may include "hot-pluggable" features, which facilitate coupling and/or uncoupling of the media devices 34 with respect to an operating computer device 14 and other operating computer components.

During operation, certain components of the computer device 14 may generate heat. Accordingly, the computer device 14 may include computer components that facilitate cooling (i.e., cooling components 46), such as fans 48, a liquid cooling system 50, and heat sinks 52. For example, such cooling components 46 may increase the efficacy of convective cooling within the computer device 14.

The computer device 14 may permit interaction with a user and/or technician via input devices 54 and output devices 56. For example, input devices may include buttons, switches, a keyboard, a light pen, a mouse, and/or a voice recognition system, all of which allow the user and/or technician to provide commands and input instructions to the computer device 14. Output devices 56, by way of example, may include a liquid crystal display (LCD), a cathode-ray tube (CRT), a series of light emitting diodes (LEDs), and/or an audio display, among others.

The computer device 14 may also communicate and interact with other devices that are appropriately linked, i.e., linked devices 58. For example, the computer device 14 may interact with other computer devices 14 that are disposed within one or more racks 12 (see FIG. 1). As another example, the computer device 14 may interact and communicate with other devices via a network, such as a wide area network (WAN), a local area network (LAN), and the Internet, among others.

To operate, the computer device 14 may receive power from a power supply 60. By way of example, the computer device 14 may receive power from an alternating current (AC) power source, such as an AC adapter plugged into a wall outlet. Advantageously, the AC adapter may rectify the AC power to an appropriate direct current (DC) power for use by the components of the computer device 14. Alternatively, if the computer device 14 is portable, the power supply 60 may include permanent batteries, portable batteries, and/or rechargeable batteries. Moreover, the power supply 60 may also include a DC adapter for plugging into a vehicle's cigarette lighter, for instance.

Figure 3:
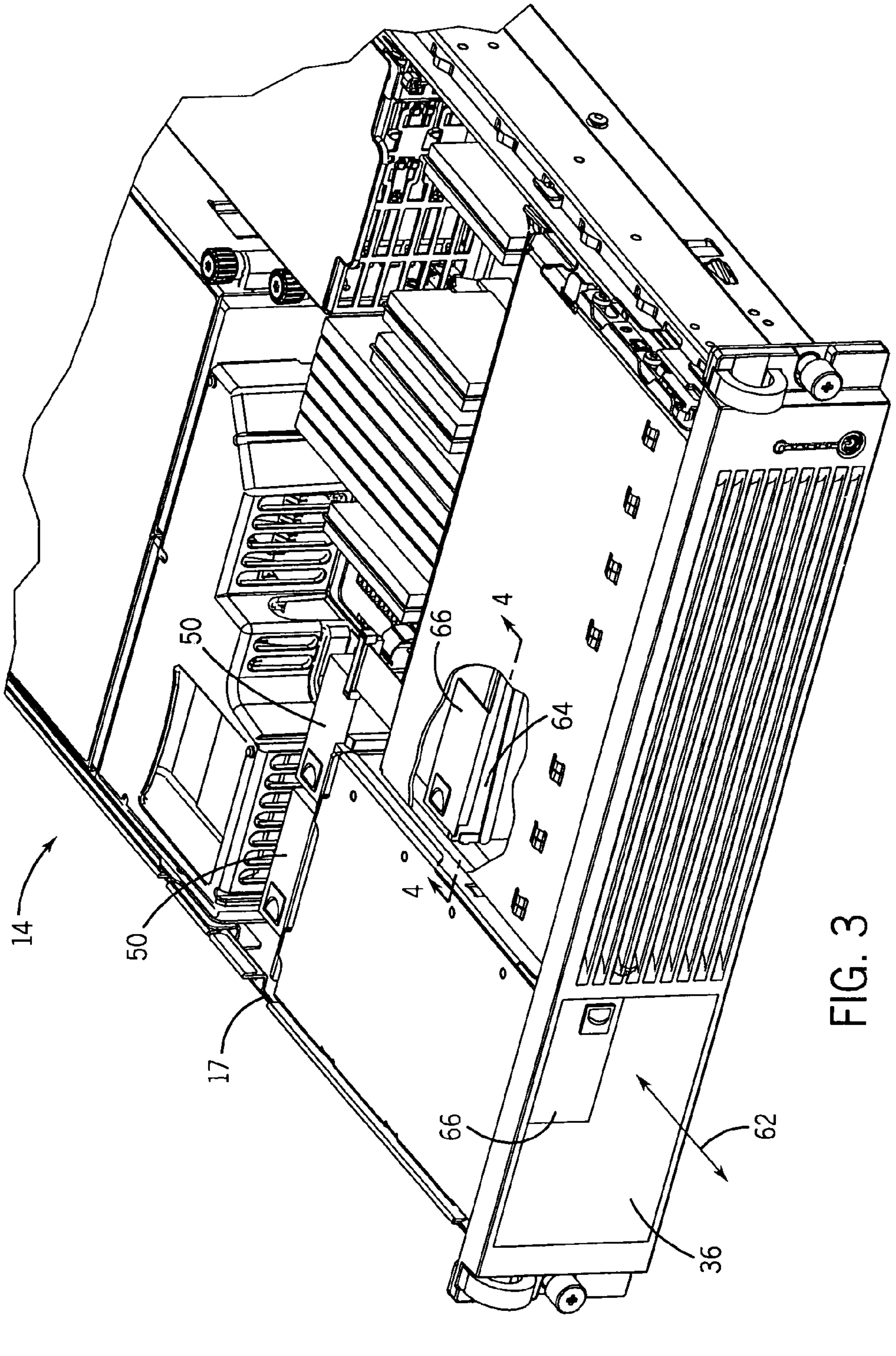
FIG. 3 illustrates a perspective view of computer device and a plurality of computer component disposed in a chassis of the computer device in accordance with embodiments of the present invention.

FIG. 3 illustrates a perspective view of various computer components coupled to the chassis 17 of the computer device 14. As discussed above, the exemplary computer device includes a hard drive 36. Advantageously, the hard drive may be "hot-pluggable," which facilitates removal or insertion of the hard drive 36 into the computer device 14 while the computer device is operating. The hard drive 36 may be removed or inserted through an access aperture located in the bezel 22 in a linear direction, as represented by bi-directional arrow 62. To dissipate heat produced by the hard drive 36 during operating, cooling fans 50 located behind the hard drive 36 may provide a cooling airflow. Additionally, the computer device may comprise one or more electronics substrates, such as a printed circuit board 64, to which certain components (e.g., memory components 28 and processors 26) may secure. As discussed further below, each of the foregoing computer components may include a biasing mechanism 66 that facilitates coupling and uncoupling of the appropriate computer component from the computer device 14.

Figure 4:
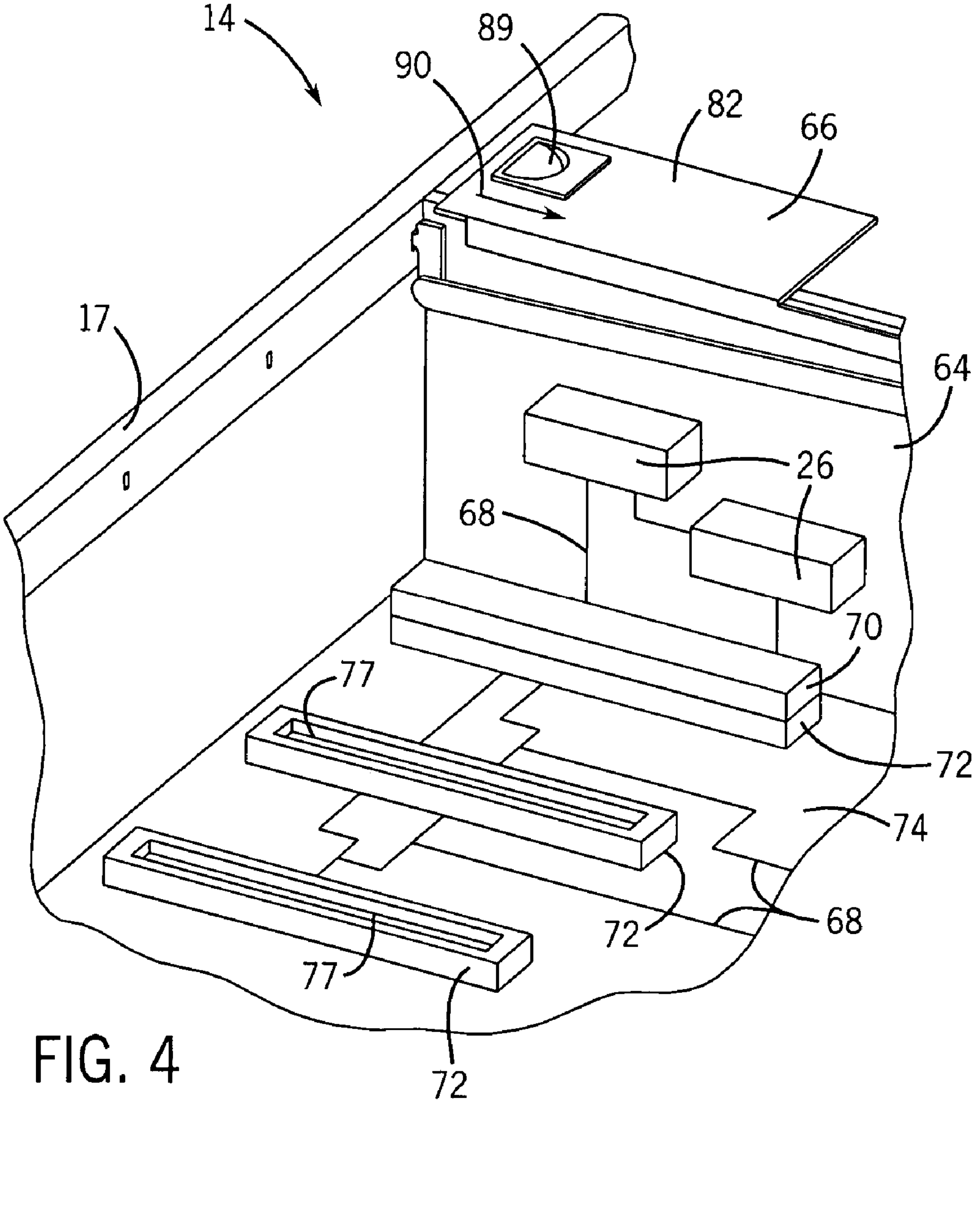
FIG. 4 illustrates a partial perspective view along line 4—4 of FIG. 3 of an exemplary computer component in an engaged position with respect to the chassis of FIG. 3 and with respect to an exemplary electrical connector in accordance with embodiments of the present invention.

FIG. 4 illustrates a partial perspective view of the exemplary printed circuit board 64 of FIG. 3 in an engaged position with respect to the computer device 14. The printed circuit board 64, as discussed above, may support a number of computer components, such as the illustrated processors 26. The exemplary processors 26 electrically communicate with one another over wiring pathways 68 located on the surface of the printed circuit board 64. The wiring pathways also may connect the processors 26 to a component electrical connector 70 secured to the printed circuit board 64 at a location towards the periphery of the printed circuit board 64. The component electrical connector 70 may couple, both electrically and physically, to a receiving electrical connector 72 located on a motherboard 74 of the computer device 14. The motherboard 74 may include various wiring pathways 68 that electrically couple the various receiving connectors 72 to one another. Moreover, the wiring pathways 68 on the motherboard 74 also may electrically couple other components of the computer device 14 to one another and to the receiving connectors 72. Accordingly, by coupling the printed circuit board 64 to the motherboard 74 via the component and receiving electrical connectors 70 and 72, the processors 26 located on the printed circuit board 64 may electrically communicate with any number of computer components in the computer device 14.

The various computer components of the exemplary computer device 14 may physically couple to the chassis 17. By way of example, the chassis 17 may comprise a metallic framework that provides structural support to the various computer components of the computer device 14. The chassis 17 may comprise a unitary piece or may comprise an assembly of parts. By way of example, FIG. 4 illustrates an exemplary portion of the chassis 17 that is configured to support the printed circuit board 64.

As discussed above, from time-to-time the printed circuit board 64, and other computer components, may benefit from removal from the computer device 14. For example, to upgrade the processors 26 in the computer device 14, a technician may remove the printed circuit board 64 and replace it with a printed circuit board 64 having more robust processors 26. Advantageously, the performance of the entire computer device 14 may improve by replacing the processors 26, thereby conserving the remaining computer components of the computer device 14. The biasing mechanism 66 may facilitate selective coupling and uncoupling of the printed circuit board 64, and other computer components, to the chassis 17 and the receiving electrical connector 72, as discussed further below.

Figure 5:
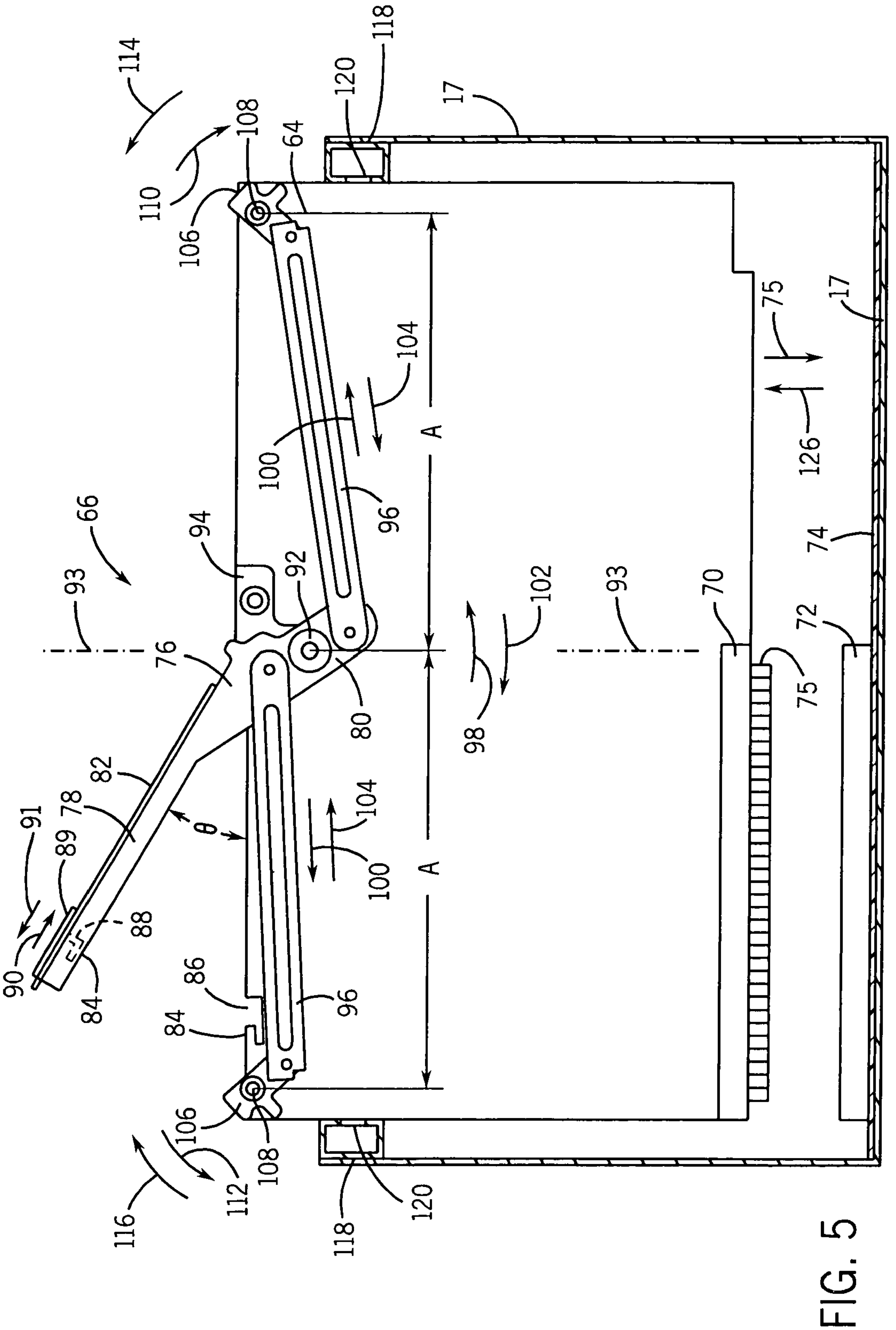
FIG. 5 illustrates a front view of a computer component in a disengaged position with respect to an electrical connector and an exemplary biasing mechanism in a disengaged configuration in accordance with embodiments of the present invention.

FIG. 5 illustrates a front view of an exemplary printed circuit board 64 in a disengaged position with respect to the computer device 14. More particularly, FIG. 5 illustrates the printed circuit board 64 just prior to engagement with or just subsequent to disengagement from the chassis 17 and the receiving connector 72 of the computer device 14. However, for the purposes of explanation, the following discussion primarily focuses on the coupling of the printed circuit board 64 to the chassis 17 and to the receiving connector 72 of the computer device 14. As the printed circuit board 64 progresses towards the receiving electrical connector 72, as represented by directional arrow 73, pins 75 located on the underside of the component connector 70 may begin to engage with corresponding slots 77 (see FIG. 4) located in the receiving connectors 72. This interaction between the pins 75 and the corresponding slots 77 may present close tolerances, i.e., a tight fit. Accordingly, as the number of pins 75 and slots 77 increases, the overall frictional resistance increases due to interference fit between each additional pair of pins 75 and slots 77. To overcome this greater resistance, an engagement force may be applied to couple the two connectors 70 and 72. Advantageously, the biasing mechanism 66 may provide leverage to couple the corresponding connectors 70 and 72 and, also, may guide the pins 75 and slots 77 into engagement with one another, as discussed further below.

Just prior to engagement, the biasing mechanism 66 of the printed circuit board 64 is in a disengaged configuration. Accordingly, an actuation member 76 or lever of the biasing mechanism 66 is positionally offset with respect to the printed circuit board 64 by an angle θ, such as 50 degrees. The exemplary actuation member 76 comprises a handle portion 78 and a flanged cam portion 80 offset with respect to the handle portion 78, as discussed further below.

The handle portion 78 may comprise a flat surface configured for manual actuation by a user. For example, the handle portion 78 may comprise a gripping region 82 (see FIG. 4) that provides a surface that a user may grasp to employ the biasing mechanism 66. Advantageously, the handle portion 78 may provide a grasping region that facilitates portability of the computer component. Additionally, the handle portion 78 may include a securing mechanism 84 configured to secure the position of the actuation member 76 to the printed circuit board 64 when in the engaged configuration, as discussed further below. More particularly, the securing mechanism 84 comprises a latch member 88 configured to engage with a groove 86 located on the printed circuit board 64. Accordingly, by moving the latch member 88 via the finger grasp 89 (see FIG. 4) in the inward direction as represented by arrow 90, the tongue of the latch member 88 may slip under the nib of the groove 86 to secure the position of the actuation member 76 with respect to the printed circuit board 64. Advantageously, the latch member 88 and the finger grip 89 may be biased outwardly (as represented by arrow 91) to prevent inadvertent release of the actuation member 76. However, the latch 88 may secure to other components of the computer device 14, such as the chassis 17 and/or the chassis rail 118, for instance.

As discussed above, the actuation member 76 also includes a flanged cam portion 80. The flanged cam portion includes a pivot aperture through which a pivot pin 92 couples the cam portion 80 to the printed circuit board 64. The pivot pin 92 may secure the actuation member substantially along a centerline 93 of the printed circuit board 64. To provide further structural support, a C-shaped mounting bracket 94 may be placed intermediate to the flanged cam portion 80 and the printed circuit board 64, such that the mounting bracket 94 straddles a top edge of the printed circuit board 64. Advantageously, the pivot pin 92 provides a pivot joint for the actuation member 76 with respect to the printed circuit board 64.

The exemplary biasing mechanism 66 also includes a pair of linking members 96, each linking member 66 having an end pivotably coupled to the flanged cam portion 80. Accordingly, pivotal movement of the cam portion 80 induces both horizontal and vertical movement in the linking members 96. For example, by pivoting the actuation member 76 and the flanged cam portion 80 in a counter clockwise direction as represented by arrow 98, the linkage members 96 move outwardly as represented by arrows 100. Correspondingly, pivotal movement of the actuation member 76 in the clockwise direction as represented by arrow 102, draws the linkage members 96 inwardly as represented by directional arrows 104.

In the exemplary biasing mechanism 66, a pair of engagement members 106 may harness the movement of the linking members 96 to facilitate engagement of the electrical connectors 70 and 72 with one another, as discussed further below. In the exemplary embodiment, the engagement members 106 pivotably couple to the printed circuit board 64 towards the upper left and right edges (with respect to the orientation of FIG. 5) of the printed circuit board 64 at substantially a distance A from the centerline 93. Advantageously, providing symmetry with respect to the engagement members 106 may achieve a more linear path of travel between the connectors 70 and 72, as discussed further below. To secure the engagement members 106 to the printed circuit board 64, each engagement member 106 may receive a fastener 108 that extends through printed circuit printed board 64 and the engagement member 106, thereby pivotably coupling the engagement member 106 to the printed circuit board 64. Additionally, the engagement members 106 of the discussed biasing mechanism 66 pivotably couple to the linking members 96. In other words, one end of each exemplary linking member 96 pivotably couples to the flanged cam portion 80 and the other end pivotably couples to one of the of the engagement members 106. Thus, the linking members 96 pivot in response to pivotal movement of the actuation member 76. For example, pivoting the actuation member 76 in the clockwise direction (arrow 102) causes the linking members 96 to translate inwardly (arrows 104) and, in turn, causes the right engagement member 106 (with respect to the orientation of FIG. 5) to pivot in a clockwise direction (arrow 110) and causes the left engagement member 106 to pivot in a counter clockwise direction (arrow 112). By contrast, pivoting the actuation member 76 in the counter clockwise direction (arrow 98) causes the linking members 96 to translate outwardly (arrows 100), thereby causing the right engagement member to pivot in a counter clock wise direction (arrow 114) and causing the left engagement member to pivot in a clockwise direction (arrow 116).

When in the disengaged configuration, the biasing mechanism 66 and the printed circuit board 64 pass between two chassis rails 118, which provide mechanical support to the printed circuit board 64 and secure to the overall structure of the chassis 17. To provide good tolerances, the distance between the chassis rails 118 may closely correspond with the dimensioning of the printed circuit board 64. Each of the exemplary chassis rails 118 includes an engagement aperture 120 that cooperates with the corresponding engagement member 106 to bias the component connector 70 with the receiving connector 72, as discussed further below.

Figure 7:
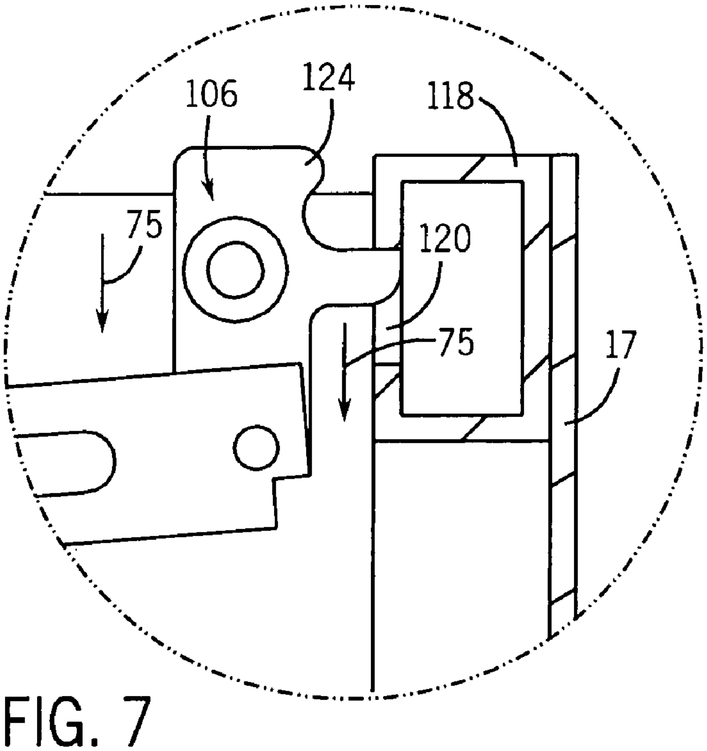
FIG. 7 illustrates a detail view of the biasing mechanism of FIG. 5 in an engaged configuration in accordance with embodiments of the present invention.
Figure 6:
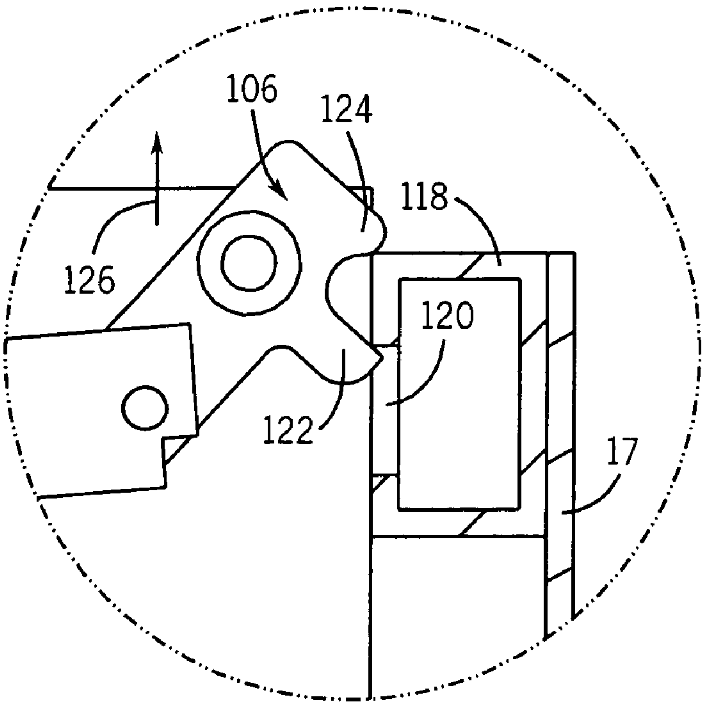
FIG. 6 illustrates a detail view of the biasing mechanism of FIG. 5 in the disengaged configuration in accordance with embodiments of the present invention.

FIG. 6 illustrates a detail view of the right engagement member 106 (with respect to FIG. 5) during an intermediate step in the engagement process. During this step, the chassis rails 118 guide movement of the printed circuit board 64 with respect to the chassis 17 and receiving connector 72. As the connectors 70 and 72 begin to interact and/or closely approach one another, the engagement members 106 may align with the engagement apertures 120. An operator may then pivot the actuation member 76 (see FIG. 5) causing the linking mechanisms 96 and the engagement members 106 to pivot and move, as discussed above. For example, to engage the connectors 70 and 72 with one another, an operator may pivot the actuation member 76 in the counter clockwise direction (arrow 98), thereby causing the right engagement member 106, to pivot counter clockwise (see arrow 114 of FIG. 5) and causing the left engagement member 106 to pivot clockwise (see arrow 116 of FIG. 5). As discussed above, the mechanical operation of the right engagement member 106 with respect to the chassis rail 118, as discussed further below, corresponds with that of the left engagement member 106. As the engagement members 106 pivot toward the chassis rails 118, engagement tabs 122 located on the engagement members 106 enter the engagement apertures 120. As the engagement members 106 continue to pivot, the engagement tabs 122 begin to abut against perimeter surfaces of the engagement apertures 120. Against these abutments, the engagement members 106 provide an engagement force that biases the printed circuit board 64 in a downward direction, as indicated by arrow 73 in FIGS. 5 and 7. Advantageously, these abutments also may facilitate an engagement force that overcomes the frictional resistance between the pins 75 of the component electrical connector 70 and the slots 77 of the receiving electrical connector 72, for example.

To uncouple the connectors 70 and 72 and/or to remove the printed circuit board 64 from the chassis 17, the foregoing discussed process operates in reverse. For example, pivoting the actuation member 76 (see FIG. 5) in the clockwise direction (arrow 102) causes the right engagement member 106 to pivot in the clockwise direction (arrow 110) and causes the left engagement 106 to pivot in the counter clockwise direction (arrow 112). As the engagement members pivot, upper tips or beaks 124 on each of the engagement members 106 begin to abut against the corresponding chassis rails 118. The beaks 124 then interact with the chassis rails 118 to provide a disengagement force that biases the printed circuit board 64 upwardly, as represented by arrow 126. The abutment between the tabs 122 and the apertures 120 also may provide a disengagement force that overcomes the frictional resistance of the engagement between the pins 75 of the component electrical connector 70 and the slots 77 of the receiving electrical connector 72, for example.

Figure 8:
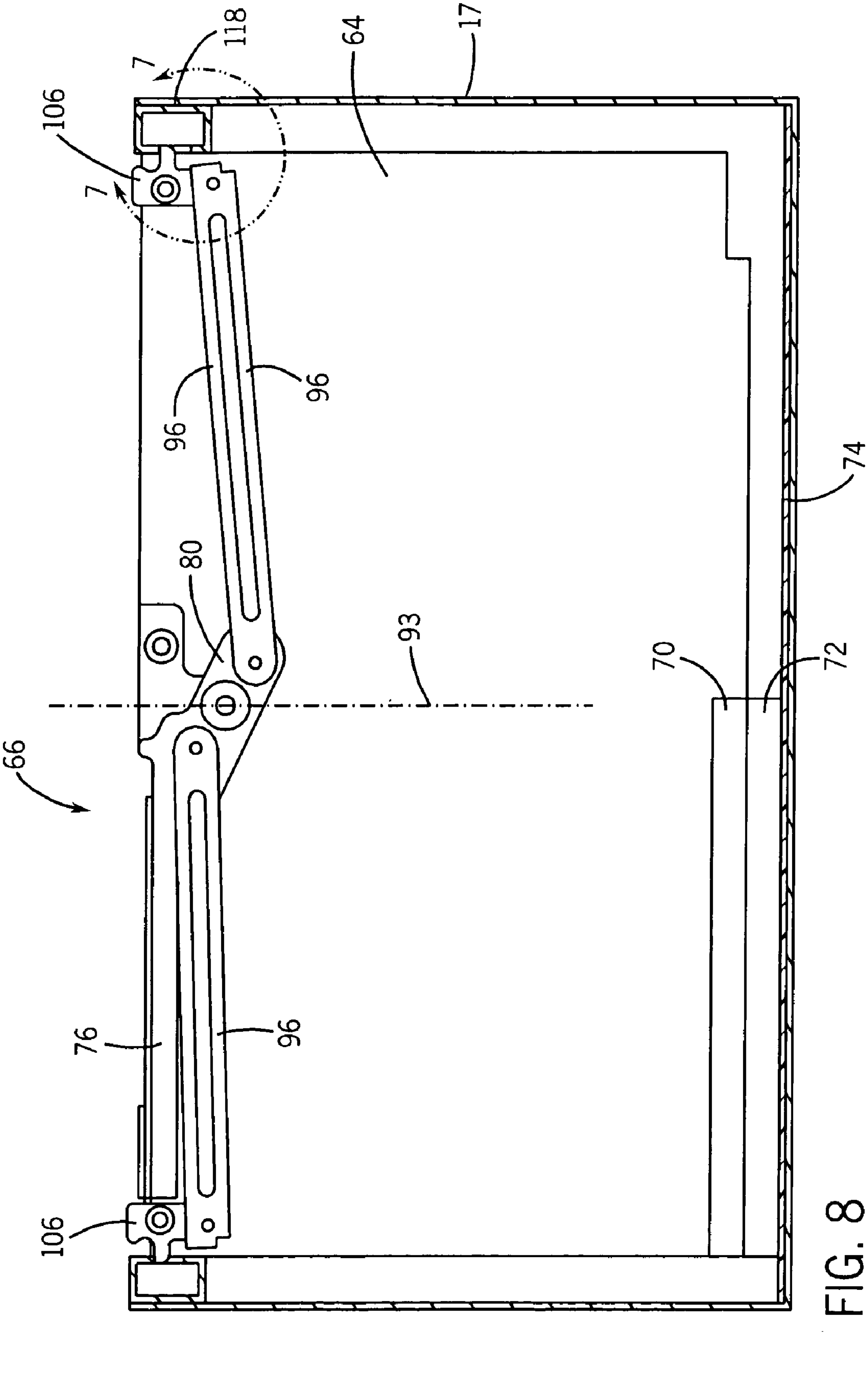
FIG. 8 illustrates a front view of a computer component in an engaged position with respect to an electrical connector and an exemplary biasing mechanism in an engaged configuration in accordance with embodiments of the present invention.

FIG. 8 illustrates the exemplary biasing mechanism 66 in an engaged configuration and the electrical connectors 70 and 72 coupled with respect to one another. When in this engaged position, the mated electrical connectors 70 and 72 along with the rails 118 and the biasing mechanism 66 cooperate to support the printed circuit board 64. As discussed above, the biasing mechanism 66 facilitates synchronized operation of the engagement members 106. In other words, an operator may operate both of the engagement members 106 in tandem by pivoting a single actuation member 76. Thus, the operator may couple and uncouple the computer component, such as the illustrated printed circuit board 64, via a single movement. Advantageously, the synchronized operation of the engagement members 106 facilitates a linear path of travel for the electrical connectors 70 and 72 with respect to one another, thereby mitigating the likelihood of damage to pins 75 (see FIG. 5) of the component electrical connector 70 due to misalignment, for example. Additionally, the exemplary biasing mechanism 66 facilitates adjacent placement of computer components with respect to one another. For example, a series of printed circuit board 64 may be located adjacent to one another without chassis components located therebetween, because the biasing forces i.e., the engagement and disengagement forces, are produced by interactions occurring towards the left and right sides of the printed circuit board 64 (as oriented in FIGS. 5 and 6). This configuration may conserve space in the computer device 14, as illustrated in FIG. 4, by facilitating proximate placement of receiving electrical connectors 72, for example.

Figure 9:
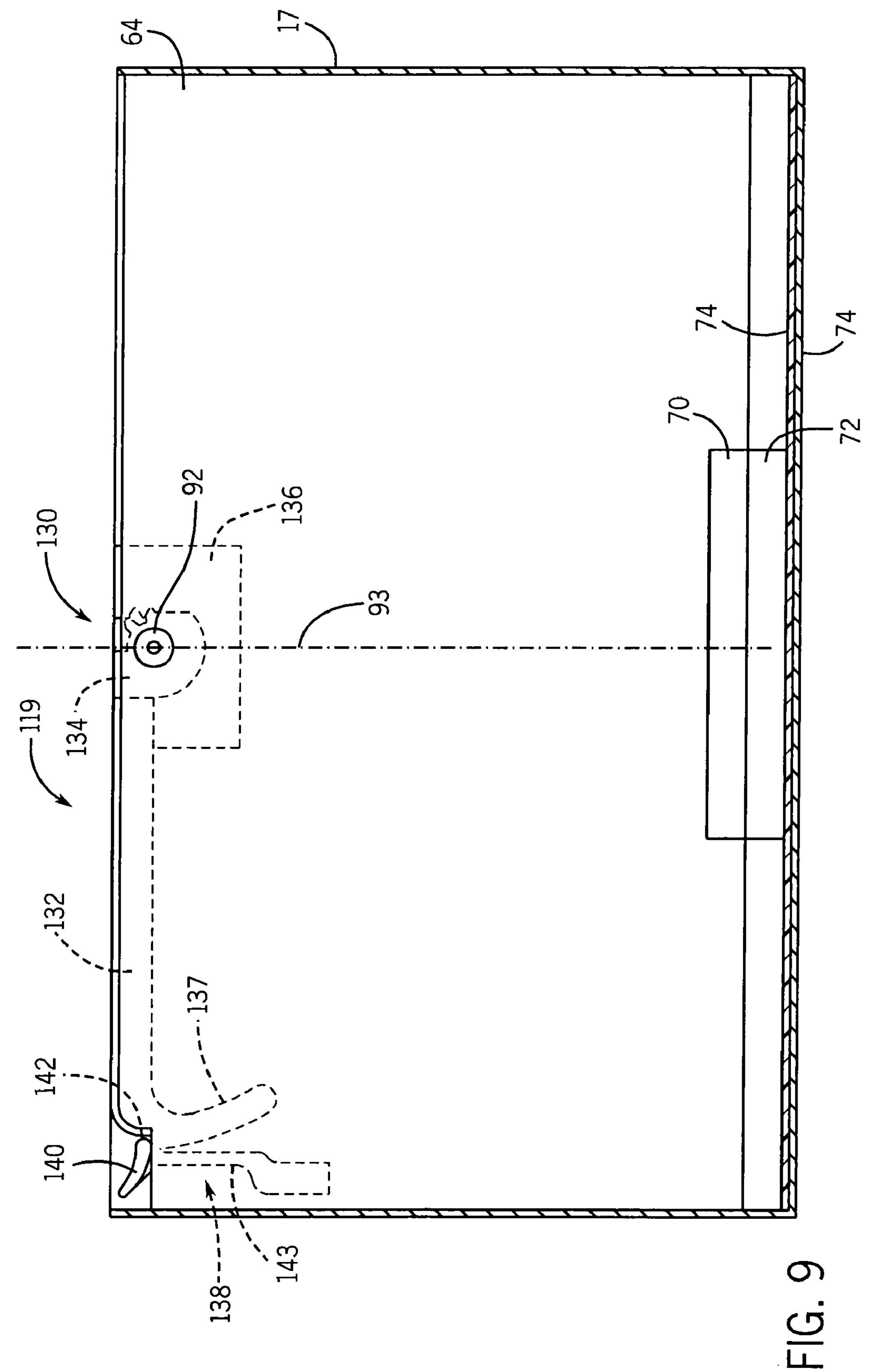
FIG. 9 illustrates a front view of an alternate embodiment of an exemplary biasing mechanism in an engaged configuration and an exemplary computer component in an engaged position with respect to an electrical connector in accordance with embodiments of the present invention.

FIG. 9 illustrates an alternate and exemplary biasing mechanism 119 in accordance with embodiments of the present invention. The exemplary biasing mechanism 119 comprises a lever system 130 for coupling and uncoupling the printed circuit board 64 with respect to chassis 17 and the electrical component connector 70 with respect to the receiving electrical connector 72. The lever system 130 includes a lever 132 for operation of the lever system 132, as discussed further below. Advantageously, the lever 132 may comprise of a robust structural material, such as metal or High Density Polyethylene, that mitigates the likelihood of damage due to operation during the application of engagement or disengagement forces. The exemplary lever 132 comprises a pinion gear portion 134. The lever 132 may mount to a backside of the printed circuit board 64 (see FIG. 11) substantially along a centerline 93 of the board via a pivot pin 92, such as the pivot pin 92 discussed above. The lever 132, more particularly the pinion gear portion 134 of the lever 132, interacts with a pinion gearing receiving member 136 mounted to the chassis 17 (see FIG. 11) to bias the printed circuit board 64 between engaged and disengaged positions, as discussed further below. The lever 132 also may include a nose portion 137 that guides pivotal movement of the lever 132 with respect to the printed circuit board 64. Advantageously, guiding pivotal movement of the lever 132 facilitates the linear coupling between the component electrical connector 70 and the receiving electrical connector 72.

To secure the position of the lever 132 with respect to the printed circuit board 64 when in the engaged configuration, the exemplary biasing mechanism 119 includes a resilient clasping mechanism 138 coupled to the backside of the printed circuit board 64. As illustrated, the clasping mechanism 138 comprises a securing tab 140 that cooperates with a platform portion 142 of the lever 132 and a resilient arm 143 that biases the securing tab into engagement with the platform portion 142 of the lever 132. Advantageously, the securing tab 140 may present an ergonomic surface configured to facilitate manual actuation of the of the securing tab 140 away from the lever 132 for placing the lever 132 into a disengaged configuration, as discussed further below.

Figure 10:
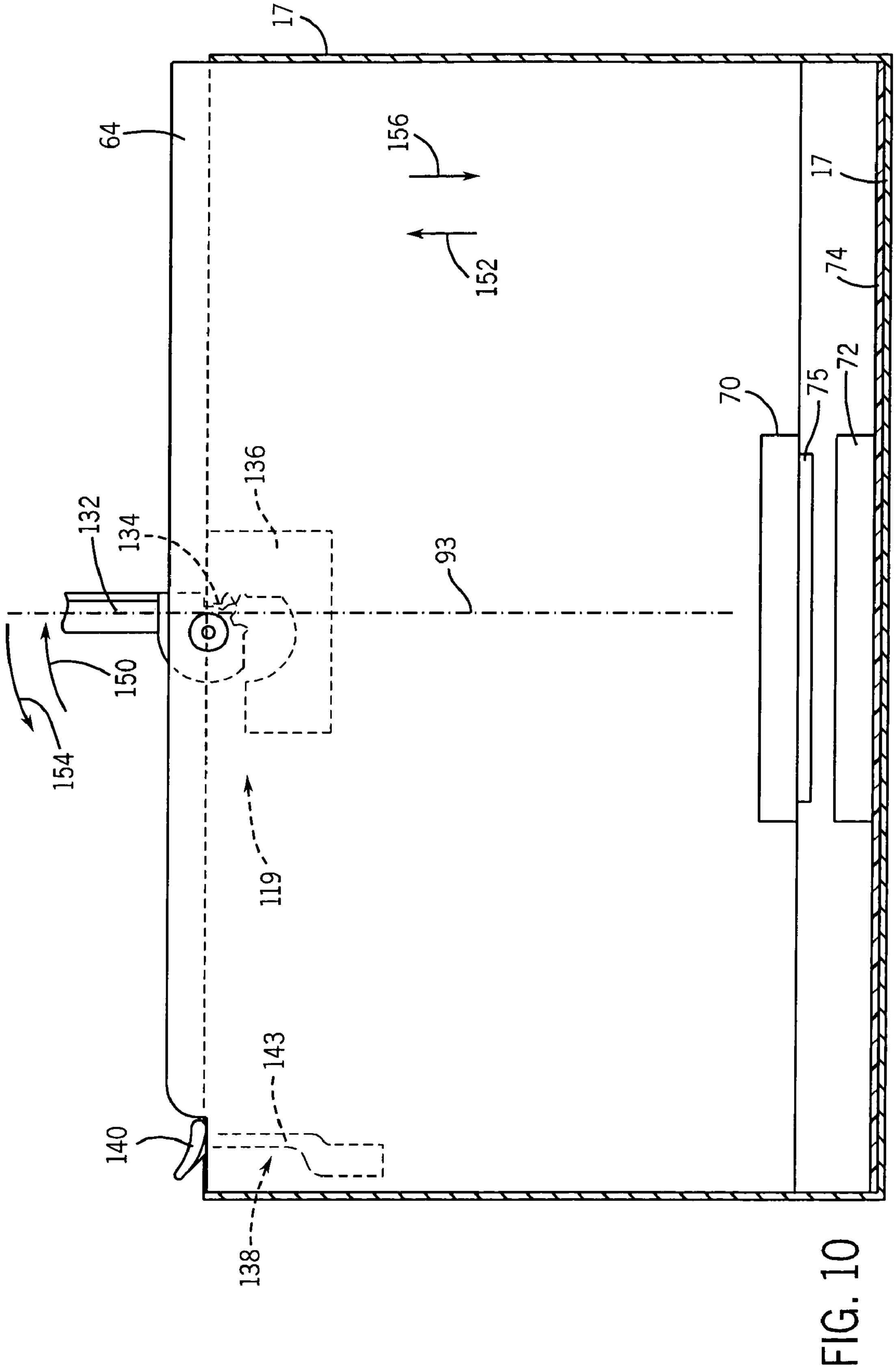
FIG. 10 illustrates a front view of the exemplary biasing mechanism of FIG. 9 in a disengaged configuration and the exemplary computer component of FIG. 9 in a disengaged position with respect to the electrical connector in accordance with embodiments of the present invention.

FIG. 10 illustrates the exemplary biasing mechanism 119 in a disengaged configuration. The lever 132, when released from the engaged configuration (see FIG. 9), may pivot in a clockwise direction as represented by directional arrow 150. During pivotal movement in this direction (arrow 150), the pinion gear portion 134 interacts with the pinion gear receiving member 136 to bias the printed circuit board 64 in an upward direction 152 into a disengaged position with respect to the chassis 17, while also biasing the electrical connectors 70 and 72 into a disengaged position with respect to one another, as discussed further below. However, by pivoting the lever 132 in the counter clockwise direction 154, the biasing mechanism 119 biases the printed circuit board 64 into an engaged position with respect to the chassis 17, while biasing the printed circuit board 64 and the component electrical connector 70 in a downward direction 156 into an engaged position with the receiving electrical connector 72. Advantageously, coupling the lever 132 substantially along the centerline of the printed circuit board 64 facilitates a linear path of travel between the component electrical connector 70 and the receiving electrical connector 72, thereby mitigating the likelihood of damage to the pins 75 due to misalignment. Specifically, the positioning of the lever 132 substantially along the centerline 93 mitigates the occurrence of moment forces applied to the printed circuit board 64 during engagement or disengagement, again, by facilitating linear movement of the printed circuit board 64.

Figure 11:
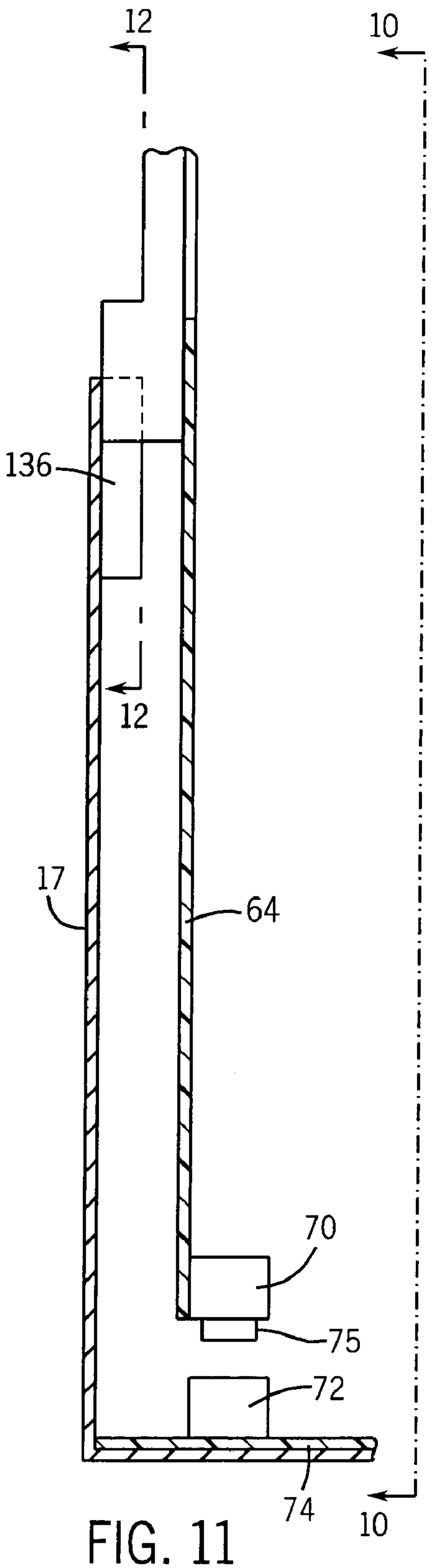
FIG. 11 illustrates a cross-sectional view of the chassis and computer component of FIG. 10 along line 11—11 of FIG. 10 in accordance with embodiments of the present invention.
Figure 12:
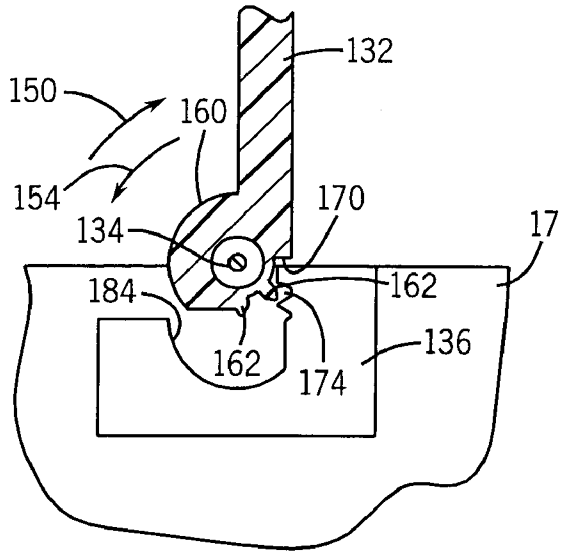
FIG. 12 illustrates a partial cross-sectional view of the biasing mechanism of FIG. 11 along 12—12 of FIG. 11 in accordance with embodiments of the present invention.

FIG. 12 illustrates a cross-sectional detail view of the pinion gear portion 134 and the pinion gear receiving member 136 along line 12—12 of FIG. 11. The pinion gear portion 134 and the pinion gear receiving member 136 are illustrated in the disengaged configuration with respect to one another. The pinion gear portion 134 comprises an arcuate portion 160 and a plurality of teeth 162. As the printed circuit board 64 is brought into engagement with the chassis 17 (see FIG. 11), a stopping surface 170 on the pinion gear portion 134 abuts against the pinion gear receiving member 136. This abutment prevents further downward movement (see arrow 156 of FIG. 10) of the printed circuit board 64 with respect to the chassis 17 and also facilitates alignment of the 132 lever with the pinion gear receiving member 136, thereby facilitating alignment of the printed circuit board 64 with respect to the chassis 17 and alignment of the electrical connectors 70 and 72 with respect to one another.

To bias the printed circuit board 64 downwardly (see arrow 156 of FIG. 10), the teeth 162 of the pinion gear portion 134 engage with corresponding notches 174 located on the pinion gear receiving member 136. Accordingly, by pivoting the lever 132 in a counter clockwise direction 154, the pinion gear portion 134 pivots and causes the teeth 162 to interact with the notched portions 174. For example, by pivoting the lever 132 and pinion gear portion 134 counter clockwise as represented by arrow 154, the teeth 162 abut against the notched portions 174. Accordingly, the interaction between these two structures (i.e., the notched portions 174 and the teeth 162) produces a linear downward (see arrow 156 of FIG. 10) motion in the printed circuit board 64, thereby facilitating engagement between the electrical connector 70 and the receiving connector 72 (see FIG. 10). Advantageously, the pinion gear receiving member 136 includes an arcuate receiving surface 184 that cooperates with the arcuate portion 160 of the lever 132 to guide travel of the pinion gear portion 134 with respect to the pinion gear receiving member 136.

Figure 13:
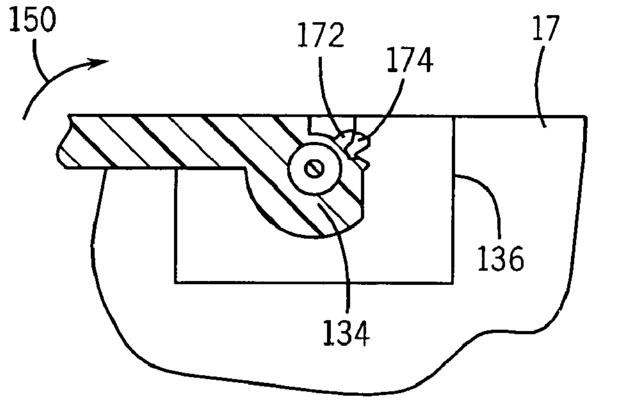
FIG. 13 illustrates a partial cross-sectional view of the biasing mechanism of FIG. 12 in an engaged configuration in accordance with embodiments of the present invention.

FIG. 13 illustrates the pinion gear portion 134 and pinion gear receiving member 136 in an engaged configuration with respect to one another. In this configuration, the printed circuit board 64 is engaged with the chassis 17 and the electrical connectors 70 and 72 are engaged with respect to one another. Accordingly, to disengage these elements, a user may actuate the lever 132 in a clockwise direction to bias the printed circuit board upwardly, as represented by arrow 152 in FIG. 10. Similar to the foregoing discussion, the teeth 162 interact with the notched portions 174 to produce this biasing force.

What claimed is:

1. An apparatus, comprising:

a leverage member pivotable with respect to an electronic component securable with respect to a chassis;

a first engagement member located on a first side of a centerline of the electronic component and a second engagement member located on a second side of the centerline of the electronic component opposite the first side, wherein the first and second engagement members pivot with respect to the electronic component in response to the actuation of the leverage member, and wherein the first and second engagement members are configured to cooperate with the chassis to provide an engagement biasing force and a disengagement biasing force between the electronic component and the chassis;

a first linkage member pivotably coupled to the leverage member and the first engagement member;

a second linkage member pivotably coupled to the leverage member and the second engagement member; and wherein the first and second linkage members are configured to pivotably actuate the first and second engagement members in response to actuation of the leverage member to bias a first electrical connector coupled to the electronic component between engaged and disengaged positions with respect to a second electrical connector coupled on the chassis.

2. The apparatus as recited in claim 1, comprising a securing mechanism configured to selectably secure the position of the leverage member with respect to the electronic component.

3. The apparatus as recited in claim 1, wherein the leverage member and the first and second engagement members are coupled to the electronic component.

4. The apparatus as recited in claim 3, wherein the electronic component comprises a computer component.

5. The apparatus as recited in claim 4, wherein the computer component includes a processor.

6. The apparatus as recited in claim 4, wherein the computer component comprises a data storage device.

7. An apparatus, comprising:

an electronic component having a first electrical connector;

a leverage member pivotably coupled to the electronic component at a pivot joint;

first and second biasing members pivotably coupled to the electronic component at first and second nonadjacent edges, respectively;

first and second linkage members pivotably coupled to the leverage member and to the first and second biasing members, respectively;

wherein the first and second biasing members cooperate to bias the first electrical connector between disengaged and engaged positions with respect to a second electrical connector in response to actuation of the leverage member.

8. The apparatus as recited in claim 7, wherein the electronic component comprises a computer component.

9. The apparatus as recited in claim 8, wherein the computer component comprises a processor.

10. The apparatus as recited in claim 8, wherein the computer component comprises a cooling device.

11. The apparatus as recited in claim 8, wherein the computer component comprises an electronics substrate.

12. The apparatus as recited in claim 7, wherein the first and second biasing members are each located substantially at a substantially equal distance from a centerline of the electronic component.

13. The apparatus as recited in clam 7, wherein the leverage member pivotably couples to the electronic component substantially along a centerline of the electronic component.

14. A computer device, comprising:

a chassis;

a first electrical connector electrically coupled to a first computer component disposed in the chassis;

a second computer component having a second electrical connector configured to engage with the first electrical connector;

a biasing mechanism cooperative with the chassis to provide an engagement biasing force and a disengagement biasing force between the second component and the chassis, comprising:

a leverage member pivotable with respect to the second computer component; and first and second biasing members pivotably coupled to the leverage member at opposite sides of the second computer component, wherein the first and second biasing members are configured to bias the second electrical connector between engaged and disengaged positions with respect to the first electrical connector in response to actuation of the leverage member;

a first linkage member pivotably coupled to the first biasing member and the leverage member, and a second linkage member pivotably coupled to the second biasing member and the leverage member.

15. The computer device as recited in claim 14 wherein the leverage member is coupled to the second computer component.

16. The computer device as recited in claim 14, wherein the second computer component comprises a processor.

17. The computer device as recited in claim 11, wherein the chassis comprises notched portions configured to receive the first and second biasing members respectively.

18. The computer device as recited in claim 11, wherein the leverage member comprises a securing mechanism configured to secure the position of the actuation member with respect to the second electronic component.

19. A computer device, comprising:

means for synchronously pivoting first and second engagement members located on opposite sides of a computer component and extendable beyond opposite edges of the computer component, and cooperative with a computer device chassis to provide an engagement biasing force and a disengagement biasing force on the computer component; and means for leveraging the means for synchronously pivoting to bias the first and second engagement members cooperatively to bias the computer component between engaged and disengaged positions with respect to a computer device.

* * * * *